United States Patent [19]
Naura et al.

[11] Patent Number: 6,034,895
[45] Date of Patent: Mar. 7, 2000

[54] METHOD AND CIRCUIT FOR THE PROGRAMMING AND ERASURE OF A MEMORY

[75] Inventors: David Naura; Jean Devin, both of Aix en Provence, France

[73] Assignee: SGS-Thomson Microelectronics S.A., Gentilly, France

[21] Appl. No.: 09/198,431

[22] Filed: Nov. 24, 1998

Related U.S. Application Data

[62] Division of application No. 08/703,811, Aug. 27, 1996.

[30] Foreign Application Priority Data

Sep. 5, 1995 [FR] France .................... 95 10577

[51] Int. Cl.⁷ .................................................. G11C 16/04
[52] U.S. Cl. .................. 365/185.19; 365/185.18
[58] Field of Search ........................ 365/185.19, 185.18, 365/185.08

[56] References Cited

U.S. PATENT DOCUMENTS

| | | | |
|---|---|---|---|
| 4,488,060 | 12/1984 | Simko | 327/170 |
| 4,628,487 | 12/1986 | Smayling | 365/185.19 |
| 4,996,571 | 2/1991 | Kume et al. | 357/23.5 |
| 5,365,121 | 11/1994 | Morton et al. | 327/170 |
| 5,428,568 | 6/1995 | Kobayashi et al. | 365/185 |
| 5,455,794 | 10/1995 | Javanifard et al. | 365/185 |
| 5,493,141 | 2/1996 | Ricco et al. | 257/321 |
| 5,615,153 | 3/1997 | Yiu et al. | 365/185 |
| 5,703,807 | 12/1997 | Smayling et al. | 365/185.03 |
| 5,774,390 | 6/1998 | Tailliet | 364/807 |
| 5,792,670 | 8/1998 | Pio et al. | 437/43 |
| 5,856,946 | 1/1999 | Chan et al. | 365/185.19 |
| 5,883,833 | 3/1999 | Naura et al. | 365/185.19 |

FOREIGN PATENT DOCUMENTS 0 621 603  10/1994  European Pat. Off. ........ G11C 16/06

OTHER PUBLICATIONS

French Search Report from French Patent Application No. 95 10577, filed Sep. 5, 1995.

*Primary Examiner*—David Nelms
*Assistant Examiner*—Gene N. Auduong
*Attorney, Agent, or Firm*—Wolf, Greenfield & Sacks, P.C.; James H. Morris; Theodore E. Galanthay

[57] ABSTRACT

A method and apparatus for the programming and erasure of a memory cell made out of floating-gate transistors and to the circuit pertaining thereto is described. It can be applied especially to non-volatile electrically erasable and programmable memories, for example EEPROMs and flash EPROMs. A programming voltage or erasure voltage comprising a voltage shift equal in value to a reference voltage is produced, followed by a voltage ramp comprising a rising phase followed possibly by voltage plateau, this voltage ramp being shifted in voltage by the value of the reference voltage and being followed, in turn, by a voltage drop. The value of the voltage shift is fixed at an intermediate value that is lower than the value of a so-called tunnel voltage of the memory cell but greater than the supply voltage.

18 Claims, 4 Drawing Sheets

METHOD AND CIRCUIT FOR THE PROGRAMMING AND ERASURE OF A MEMORY

CROSS REFERENCE TO RELATED APPLICATIONS

This application is a division of application Ser. No. 08/703,811, filed Aug. 27, 1996, entitled METHOD AND CIRCUIT FOR THE PROGRAMMING AND ERASURE OF A MEMORY, which prior application is incorporated herein by reference.

BACKGROUND OF THE INVENTION

1. Field of the Invention

The invention relates to a method and apparatus for the programming and erasure of a memory cell made out of floating-gate transistors. It can be applied especially to non-volatile electrically erasable and programmable memories, for example, EEPROMs and flash EPROMs.

2. Discussion of the Related Art

The memory cells of EEPROMs and flash EPROMs make use of a technology using floating-gate transistors. For the programming or erasure of such a memory cell, it is desirable to produce high voltages typically in the range of 15 to 20 volts.

A memory cell of an EEPROM is formed by a floating-gate transistor (FIG. 1a) comprising a control gate 101, a floating gate 102, a source region 103, a drain region 104, an oxide layer 105 and a substrate region 106. The gate 102 is said to be floating because it has no contact with the exterior that imposes a potential on it. The control gate 101 is connected to a word line of the memory and the drain region 104 to a bit line of the memory. The structure shown in FIG. 1a shows that the oxide thickness 105 between the floating gate 102 and the substrate region 106 is very small. Typically the oxide thickness 105 is in the range of some nanometers. The small oxide thickness enables the passage of electrons at this position by tunnel effect.

To program a memory cell, a highly positive voltage is applied to the word line connected to the control gate 101 of the memory cell and a zero voltage is applied to the bit line connected to the drain region 104. The application of these voltages creates a high voltage through the narrow oxide layer 105 that results in the migration of electrons towards the floating gate 102 by tunnel effect. These electrons are trapped in the floating gate 102.

Conversely, to erase a memory cell, a highly positive voltage is applied to the bit line and a zero voltage to the word line. The migration of the electrons then occurs in the reverse direction and the floating gate 102 gets discharged.

During the transfer of electrons between the floating gate 102 and the drain region 104, it is necessary that the variation of the electrical field created between these two zones should not be excessively abrupt so as not to embrittle or even damage the oxide layer 105.

Consequently, a ramp generation circuit is used, enabling the voltage applied to the gate 101 or to the drain region 104 of the memory cell to be increased linearly.

There is the known method of programming or erasing a memory cell that consists of the production of a programming voltage Vpp shown in FIG. 1b. The voltage signal applied to the drain or to the control gate of the memory cell comprises three phases:

an initial bias of the supply voltage Vcc of the memory forming a first voltage plateau 111;

a voltage ramp formed by a rising phase 112 during which the voltage climbs linearly up to a high voltage and a voltage plateau 113 in which the end of the charging (or discharging respectively) of the floating gate 102 takes place during the programming (or erasure respectively) of the memory cell. The slope of the rising phase 112 of the ramp is chosen so that the variation of the electrical field between the drain 104 and the floating gate 102 is not excessively fast and so as to limit the electron flux between these two regions; and a voltage drop 114 during which the voltage applied to the drain region 104 or the control gate 101 of the transistor of the memory cell returns to the value of the supply voltage Vcc of the memory.

An objective of the invention is to reduce the time needed to program or erase a memory cell without adversely affecting the quality of the cell.

SUMMARY OF THE INVENTION

It is proposed, according to an embodiment of the invention, to further shift the initial voltage of the rising phase 112 of the voltage ramp.

An embodiment of the invention is directed to a method for the programming or erasure of a memory cell of a non-volatile memory comprising storage elements made out of floating-gate transistors and supplied by a supply voltage (Vcc), comprising the following steps. A programming voltage (Vpp) is produced, comprising a voltage shift equal in value to a reference voltage, followed by a voltage ramp (RAMP) comprising a rising phase followed if necessary by a voltage plateau, this voltage ramp being shifted in terms of voltage by the value of the reference voltage and being followed, in turn, by a voltage drop. This programming voltage (Vpp) is applied to the cell of the memory. The value of the voltage shift may be set at an intermediate value (Vint), below the value of a so-called tunnel voltage of the memory cell but greater than the supply voltage, the so-called tunnel voltage being the minimum voltage so that there is a transfer of electrons through an oxide layer between the drain and the floating gate of a transistor representing the memory cell.

Furthermore, an embodiment of the invention relates to a circuit for the programming or erasure of a memory cell of a memory comprising a ramp generation circuit to produce a voltage ramp (RAMP). This embodiment further comprises a circuit for the generation of a programming voltage cascade-connected with the ramp generation circuit to obtain a programming voltage (Vpp), the programming voltage (Vpp) comprising a voltage shift equal in value to a reference voltage followed by a voltage ramp (RAMP) comprising a rising phase followed, as the case may be, by a voltage plateau, this voltage ramp being subjected to a voltage shift of the value of the reference voltage and being followed, in turn, by a voltage drop. This embodiment also comprises a control circuit for the application, to a memory cell, of the programming voltage (Vpp) coming from the programming voltage generation circuit, wherein the ramp generation circuit has a circuit to produce a voltage shift greater than a supply voltage of the memory but lower than a tunnel voltage of the memory cell of this memory.

BRIEF DESCRIPTION OF THE DRAWINGS

The particular features of the invention shall appear clearly in the following description made with reference to the appended figures, of which.

DETAILED DESCRIPTION

Figure 1A:
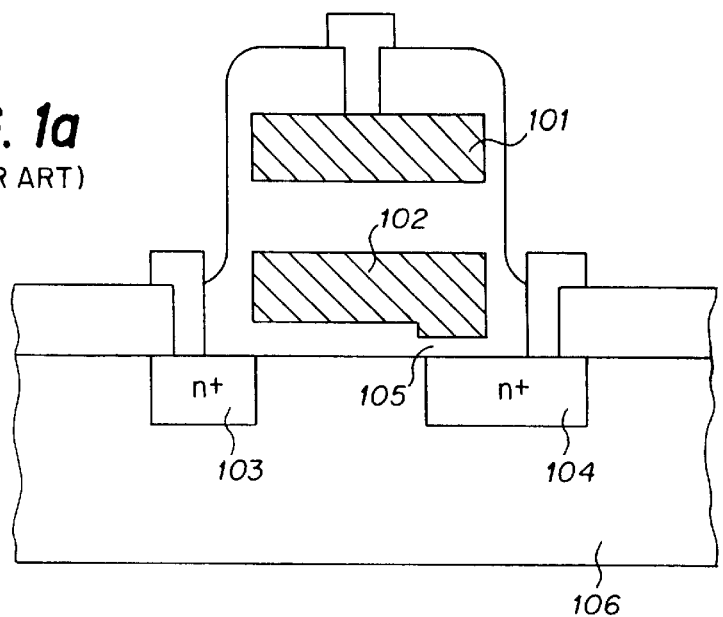
FIG. 1a shows a schematic sectional view of a floating-gate transistor.
Figure 1B:
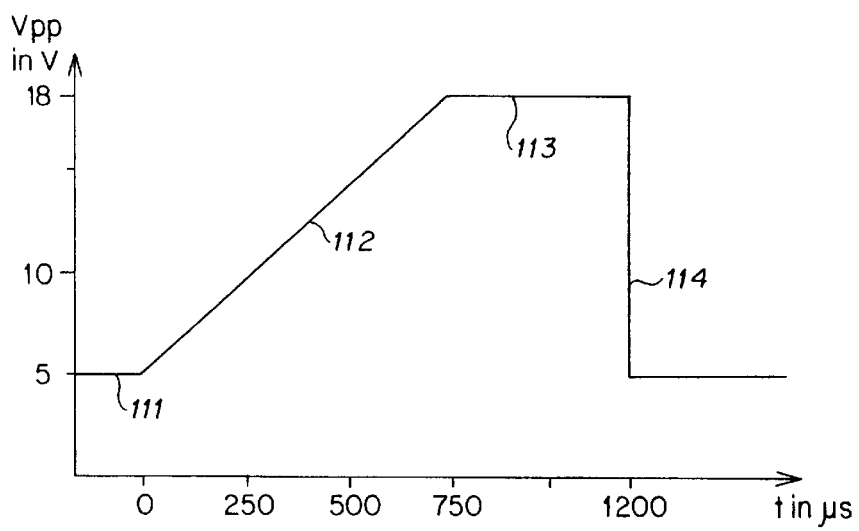
FIG. 1b shows a known timing diagram of the programming (or erasure) voltage applied to a memory cell.

FIGS. 1a and 1b, which correspond to the prior art, have been described above.

Figure 2:
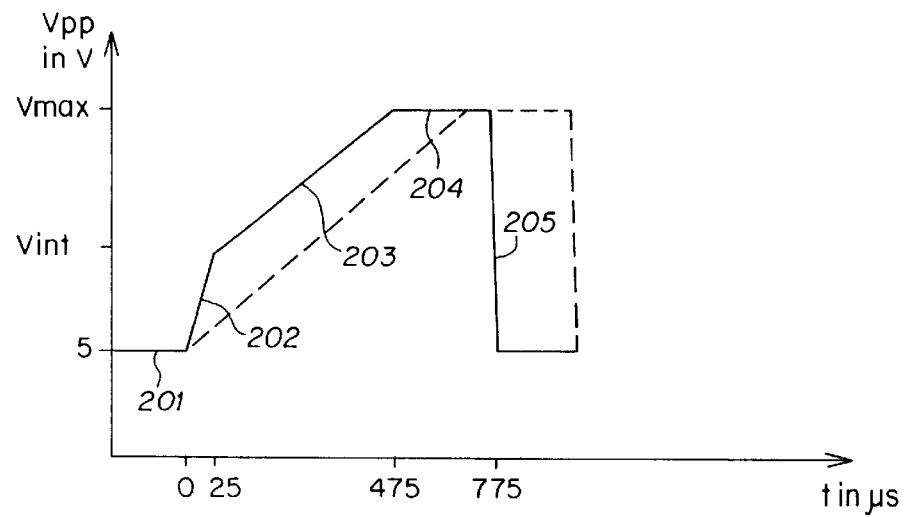
FIG. 2 shows a timing diagram of the programming voltage applied to a memory cell according to an embodiment of the invention.

FIG. 2 gives a view, according to an embodiment of the invention, of a timing diagram pertaining to the programming or erasure voltage Vpp applied to the control gate 101 (and the drain 104 respectively) to program (and erase respectively) the memory cell. It is sought to achieve a reduction of the duration of this signal.

For this purpose, the starting voltage of the rising phase of the voltage ramp is shifted by dividing this phase into two consecutive parts, in particular a first part during which the voltage rises up to an intermediate value lower than the value of the tunnel voltage of the memory cell, and a second part during which the voltage rises from this intermediate voltage up to a plateau value. To reduce the duration of the rising phase, the slope of the first part of the rising phase of the ramp is made steeper than the slope of the second part. As a variant, the first part of the rising phase is replaced by an abrupt voltage shift possibly combined with the voltage shift equal to the reference voltage which, in this case, will have even a zero duration.

In an exemplary case, the signal of the programming voltage Vpp applied to the memory cell as a function of time, shown in FIG. 2, can be broken down as follows:

a first voltage plateau 201 during which the voltage Vpp is equal to a reference voltage, for example the supply voltage Vcc;

a first part 202 of the rising phase during which the voltage Vpp reaches an intermediate voltage Vint linearly;

a second part 203 of the rising phase during which the voltage Vpp rises with a less steep slope from the intermediate voltage Vint up to a maximum voltage value Vmax;

a second voltage plateau 204 during which the voltage Vpp is equal to the maximum voltage Vmax; and a voltage drop 205 reducing the voltage Vpp to the supply voltage Vcc.

The shift in the initial voltage may be achieved here by the first part 202 of the rising phase. The intermediate value of voltage Vint is chosen so that it is slightly below the tunnel voltage. It may be recalled that the tunnel voltage is the minimum voltage needed for a charge to transit by tunnel effect through the oxide layer 105, between the floating gate and the drain region of a transistor. Typically, the value of the tunnel voltage is in the range of 10 volts.

During the period 202, there is no transfer of electrons or very little transfer of electrons between the floating gate 102 and the drain region 104 because the programming voltage Vpp applied to the memory cell is lower than the tunnel voltage. Consequently, a fast variation of the electrical field between the floating gate 102 and the drain region 104 which tends to accelerate the flux of electrons in the thin oxide layer 105 is not harmful to the memory cell during this period. This is why, during this first part 202, the slope of the voltage signal is made very abrupt so as to minimize the duration of the rise in voltage.

During the second part 203 of the rising phase, the voltage through the oxide zone 105 is close to or greater than the tunnel voltage. Consequently, the slope of the signal of the voltage Vpp is limited so that the variation of the electrical field in the oxide zone 105 is not excessively fast. This slope is fixed so as not to damage the thin oxide layer 105 by an excessively large electron flux. A slope value close to that obtained by the known method is then found again.

Then, the plateau 204 and the voltage drop 205 are respectively identical to the plateau 113 and the discharge 114.

The method of an embodiment of the invention can be used to obtain a memory cell programming time of about 700 μs. Typically this time is of the order of 1 ms with standard methods. The line of dashes in FIG. 2 highlights this exemplary improvement.

Figure 3A:
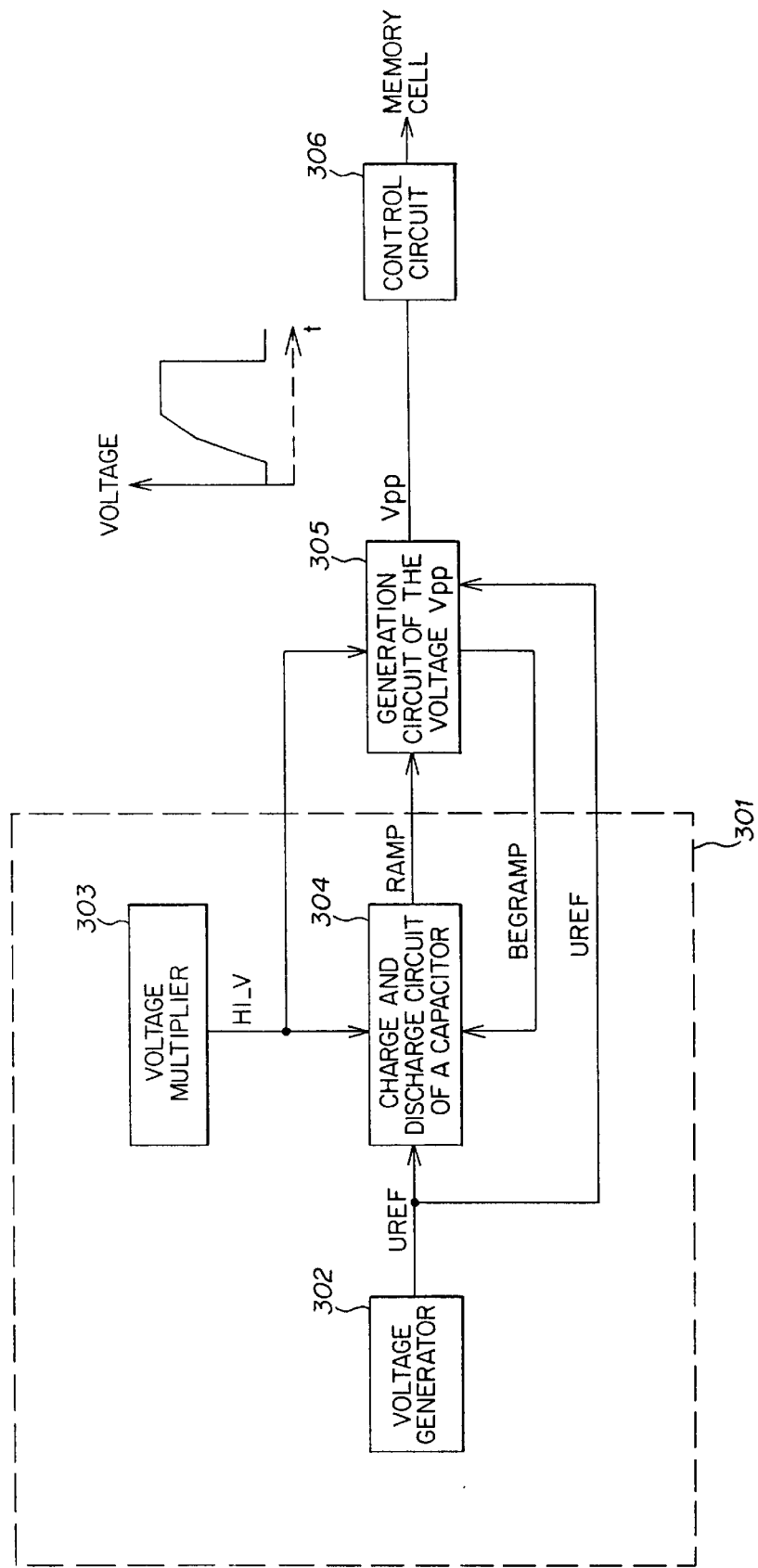
FIG. 3a shows a functional diagram of the circuit for the programming (or erasure) of a memory cell according to an embodiment of the invention.

To produce the programming voltage Vpp (FIG. 2), the circuit of FIG. 3a is described by way of example. Such a circuit represents a functional diagram of the circuit for the programming or erasure of a memory cell.

The circuit of FIG. 3a may comprise:

a ramp generation circuit 301 to produce a voltage ramp;

a circuit 305 for the generation of a programming voltage cascade-connected with the ramp generation circuit 301 to obtain the programming voltage Vpp described in FIG. 2; and a control circuit 306 for the application to a memory cell of the programming voltage coming from the circuit 305.

The ramp generation circuit 301 may comprise:

a temperature-stable voltage generator 302;

a voltage multiplier 303; and a circuit 304 for the charging and discharging of a capacitor.

The voltage generator 302 and the voltage multiplier 303 both supply the circuit 304 for the charging and discharging of a capacitor and the circuit 305 for the generation of the voltage Vpp, respectively with a voltage UREF and a voltage HI_V.

The voltage multiplier 303 may be, for example, a charge pump. A function of such a charge pump is to produce high voltages, for example in the range of 15 to 20 volts.

The value of the voltage UREF may be, for example, in the range of 1 to 2 volts.

Furthermore, the programming voltage generation circuit 305, which itself may also be supplied by the voltage generator 302 and by the voltage multiplier 303, receives a voltage ramp RAMP coming from the circuit 304 for the charging and discharging of a capacitor.

The circuit 305 may send a signal BEGRAMP to the circuit 304 for charging and discharging a capacitor. The state of the signal BEGRAMP determines the value of the slope of the signal RAMP.

Starting from the signal RAMP sent out by the circuit 301, the circuit 305 produces a programming voltage Vpp according to the voltage signal shown in FIG. 2. This voltage Vpp is then applied by means of the circuit 306 either to the word line of the cell to be modified or to its bit line according to the mode (programming or erasure) desired.

Prior to the part 202 of the rising phase, the circuit 305 modifies the state of the signal BEGRAMP and transmits the signal to the circuit 301 in order to modulate the value of the slope of the signal RAMP. The variation of the value of the slope of the ramp is obtained by the charging, at variable speed, of the capacitor. The plateau 204 may be obtained by the discharging of this same capacitor.

During the part 202 of the rising phase, the capacitor is charged with a high level of current, so that the capacitor gets charged very quickly.

During the part 203 of the rising phase, the capacitor is still charging, but with a lower current. The result of this is that the slope of the signal RAMP is lower than it was previously.

The voltage of the ramp varies twice linearly during the parts 202 and 203 of the rising phase, for the capacitor gets charged with constant currents during these two periods.

Figure 3B:
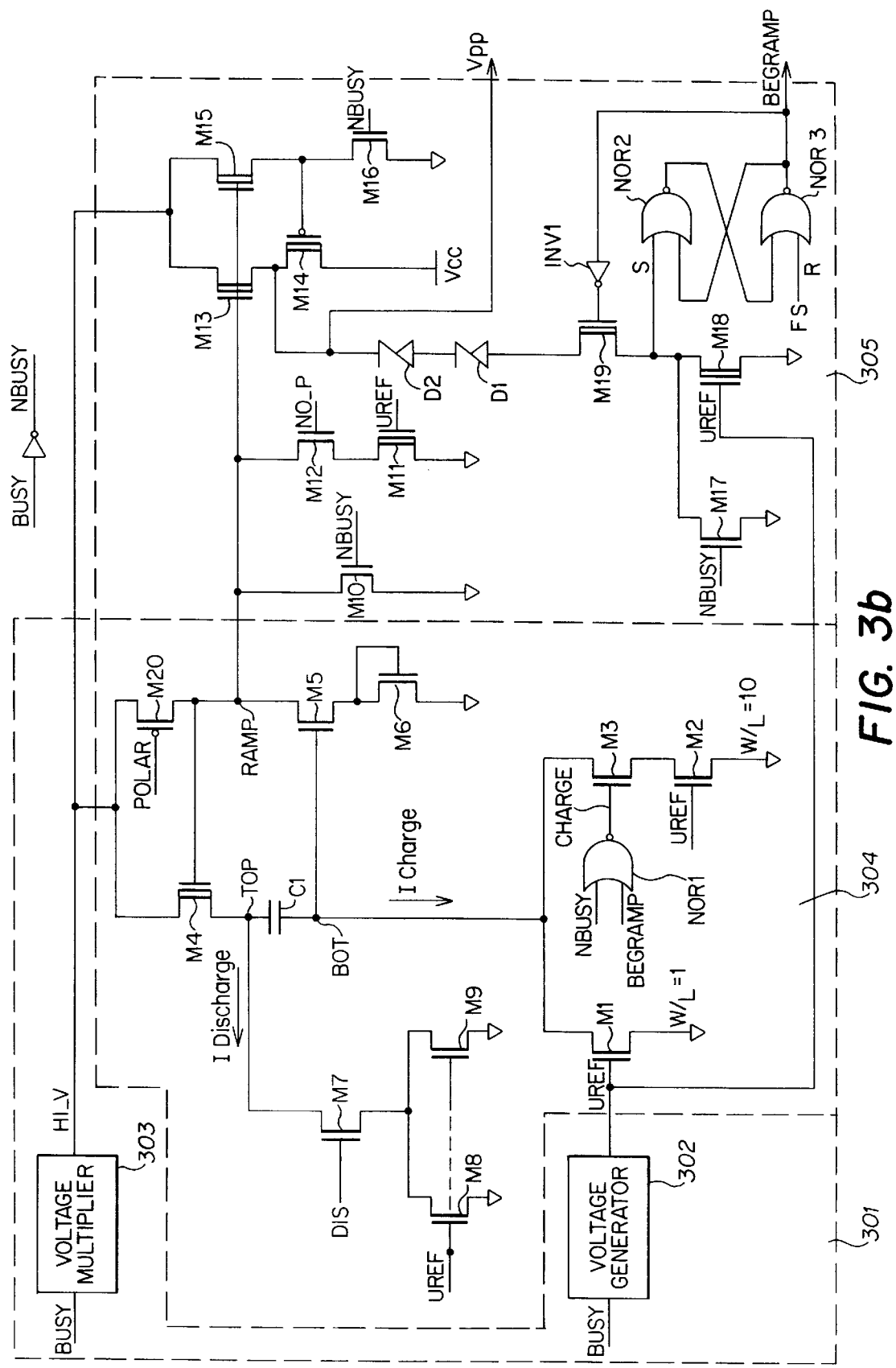
FIG. 3b shows an electronic diagram of the circuit for the programming or erasure of a memory cell according to an embodiment of the invention.

A possible physical embodiment of the circuits 301 and 305 is proposed in FIG. 3*b*. The form of all the signals used to implement this embodiment is described in FIG. 3*c*. For a clearer understanding of the operation of the embodiment, in the electronic diagram (FIG. 3*b*), the connections of the circuit shall be designated by the signals that they convey.

The voltage multiplier 303 provides the voltage HI_V to the drain of a native transistor M4 of the circuit 304 and to the source of a transistor M20 of this same circuit 304. A native transistor is a transistor that has not received any complementary implantation in its conduction channel. The conduction threshold voltage is of such a native transistor typically of the order of 0.2 volts.

The transistor M20 receives a signal POLAR at its gate. The signal POLAR corresponds to a bias voltage of the transistor M20. In one example, the signal POLAR is equal to 14 volts when the voltage HI_V equals 15 volts.

The gate of the transistor M4 is connected to the drain of the transistor M20 and its source is connected to a first terminal, called the upper terminal, of a capacitor C1. The voltage present at this upper terminal is called TOP. A second terminal, called a lower terminal, of the capacitor C1 is connected to the gate of a transistor M5. The voltage present at this terminal is called BOT.

Furthermore, the drain of the transistor M5 is connected to the gate of the native transistor M4 and delivers the signal RAMP, and its source is connected to the gate and to the drain of a transistor M6. The source of the transistor M6 is connected to the ground. In this circuit, the transistor M6 is used as a resistor. The set formed by the transistors M4, M5 and M6 represents a circuit for the regulation of the charging current for the capacitor C1.

The voltage generator 302 chosen to be a temperature-stable generator, supplies the gate of two transistors M1 and M2 of the circuit 304 with the voltage UREF. The source of the transistors M1 and M2 is connected to the ground. The drain of the transistor M2 is connected to the source of a transistor M3. The transistor M3 receives a signal CHARGE at its gate coming from a NOR gate called NOR1 receiving the signals NBUSY and BEGRAMP at its inputs. The drain of the transistors M1 and M3 is connected to the lower terminal of the capacitor C1. The part of the circuit containing the transistors M1, M2, M3 and the gate NOR1 constitutes the circuit for charging the ramp generation circuit 301. The term "charging current" ICharge designates the total current flowing through the transistors M1 and M2.

The circuit 301 also has a transistor M7 whose drain is connected to the upper terminal of the capacitor C1. The source of the transistor M7 is connected to the drains of several parallel-connected transistors represented by two transistors M8 and M9. The voltage generator 302 supplies the gates of the transistors M8 and M9 with the voltage UREF. The source of the transistors M8 and M9 is connected to the ground. The transistor M7 is controlled by a signal DIS supplying its gate. The term "discharge current" IDischarge designates the current flowing through the transistor M7. The number of transistors in parallel with the transistors M8 and M9 is a function of the desired discharge current.

The signal RAMP coming from the circuit 301 is then processed by the circuit 305 to produce the programming voltage Vpp. The signal RAMP supplies the gates of two native transistors M13 and M15. The voltage multiplier 303 delivers the voltage HI_V at the drains of these two transistors. The sources of the native transistors M13 and M15 are respectively connected to the source of the nature transistor M14 and to the drain of the transistor M16. It will be noted that all the transistors used in this circuit are of an N type except for the transistors M14 and M20. The drain of the native transistor M14 is connected to a supply voltage equal to the supply voltage Vcc of a memory. The gate ofthetransistorM14 is connected to the drain of the transistor M16. Finally the source of the transistor M16 is connected to the ground and its gate receives the signal NBUSY. The circuit formed by these four transistors (M13 to M16) is a bias circuit laying down the supply voltage Vcc as the reference voltage of the voltage signal Vpp.

The voltage signal Vpp is available at the source of the transistor M13 and is subjected to a level detector. If the voltage Vpp is greater than the intermediate voltage Vint, the signal BEGRAMP coming from the voltage detector is at 1. If not, it is at 0.

This level detector has an RS flip-flop circuit, three transistors M17, M18 and M19 and two zener diodes D1 and D2.

The RS flip-flop circuit is formed by two NOR gates, NOR2 and NOR3. This flip-flop circuit has two inputs R and S. It receives a signal FS at the input R and delivers the signal BEGRAMP at output. The signal BEGRAMP is transmitted to one of the inputs of the gate NOR1 of the circuit for charging the circuit 301.

The parallel-connected transistors M17 and M18, which receive the signals NBUSY and UREF respectively at their gates, have their sources connected to the ground and their drains connected to the input S of the RS flip-flop circuit.

The native transistor M19, in series with the two transistors M17 and M18, has its source connected to the input S of the flip-flop circuit. The drain of the native transistor M19 is connected to the cathode of a first zener diode D1 series-connected with a second zener diode D2 whose anode is connected to the source of the native transistor M14. Furthermore, the signal BEGRAMP is brought to the gate of the native transistor M19 after having been modified by an inverter INV1.

Finally, the circuit may also comprises the transistor M10 connected between the output RAMP of the circuit 301 and the ground and controlled by the signal NBUSY. This transistor M10 enables the cancelling of the signal RAMP when NBUSY goes to 1. The transistors M11 and M12, series-connected between the output RAMP of the circuit 301 and the ground and controlled respectively by the signals UREF and NO_P, make it possible to bring about the return 205 to the supply voltage constituting the bias voltage of the circuit 305.

Figure 3C:
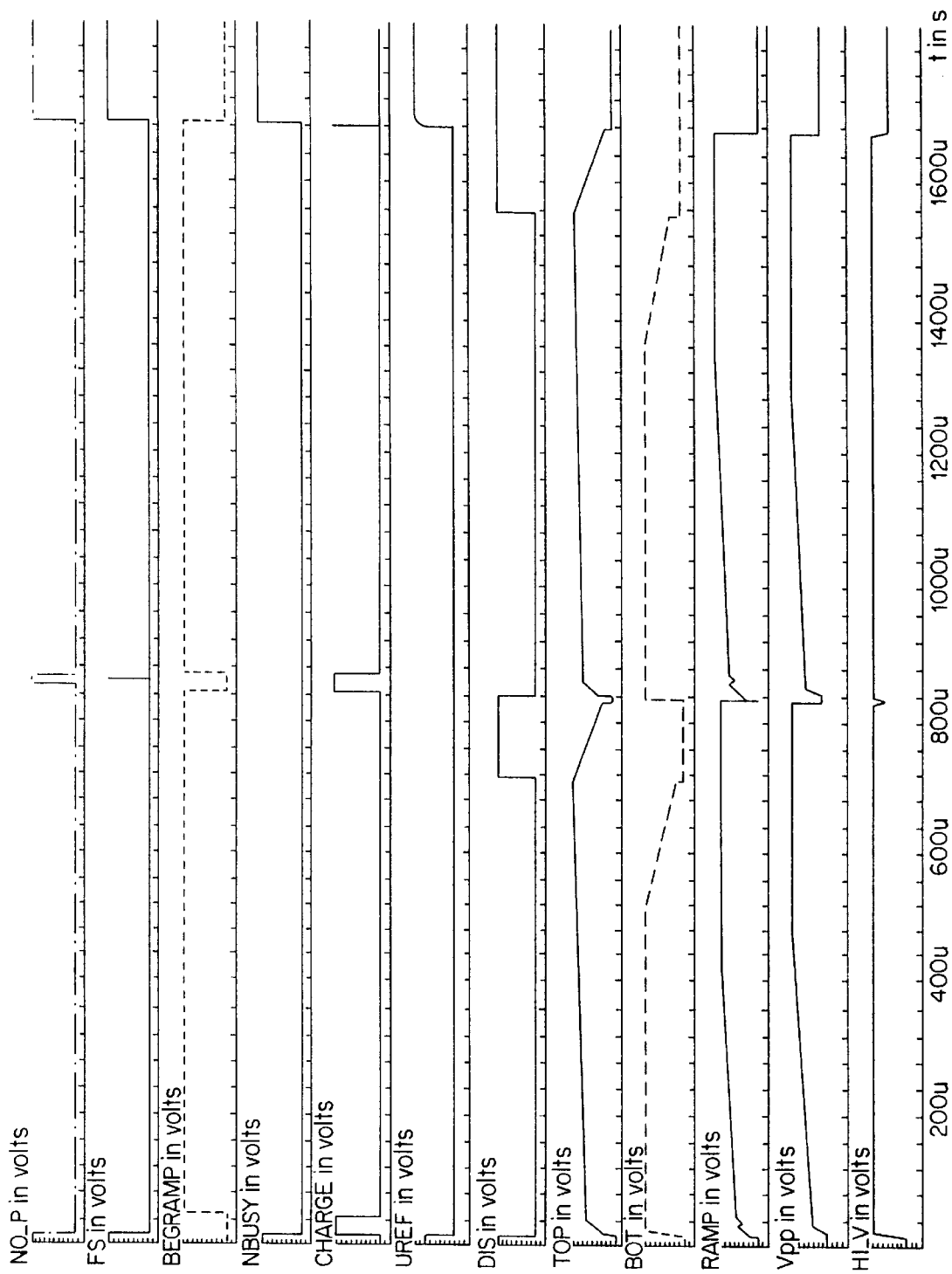
FIG. 3c shows a timing diagram of the signals that come into play in the operation of the circuit of an embodiment of the invention.

By means of the timing diagrams of the signals used in the circuit and shown in FIG. 3*c*, the operation of the circuit will be described. In the embodiment chosen, the value of the intermediate voltage Vint is set at 10 volts. The operation will be explained through the five phases of the programming voltage Vpp (FIG. 2).

For turning on of the device, the signal BUSY goes to 1. The stable voltage generator 302 and the voltage multiplier 303, controlled at input by the signal BUSY, respectively deliver a temperature-stable voltage UREF and a high voltage HI_V.

During the plateau 201, the voltage Vpp is equal to the reference voltage given by the sub-circuit formed by the transistors M13 to M16. In this example, this reference voltage is equal to the supply voltage Vcc. During this phase, the signal NO_P goes to 0 and the transistor M11 goes off. The voltage RAMP can then start rising. So long as the voltage RAMP is below the reference voltage, the voltage Vpp remains equal to this reference voltage.

During this phase, the signal FS transitions to 1 by means of ancillary circuits. The changing of the state of the input R of the RS flip-flop implies the passage of the signal BEGRAMP to 0. The signal CHARGE then goes to 1. The signal FS then again goes very swiftly to 1 but this in no way modifies the state of the signal BEGRAMP.

The transistors M1 and M2 supplied by the voltage UREF are on. The voltage UREF applied to the gate of the transistors M1 and M2 is constant and stable. The transistors M1 and M2 then behave like constant current sources. The transistor M2 imposes a very high current because it has a very great conduction channel width. In the example of FIG. 3b, the transistor M12 is obtained with the parallel connection of ten transistors equivalent to the transistor M1.

The capacitor C1 then gets charged speedily with a substantial charging current ICharge and the value of the voltage RAMP swiftly reaches the reference voltage. The part 202 of the rising phase then starts.

During the part 202 of the rising phase, the capacitor C1 continues its fast charging. As and when the capacitor C1 gets charged, the potentials TOP and BOT climb. Since the potential TOP increases, the voltage RAMP increases by capacitor coupling between the gate and the source of the transistor M4.

A current regulation circuit formed by the transistors M4, M5 and M6 makes it possible to limit the variations of the charging current ICharge. When the charging current ICharge diminishes, the voltage at BOT falls. The transistor M5 approaches the off state, and becomes more resistant. The value of the voltage of the signal RAMP tends to rise and approaches the voltage HI_V. It is recalled that the transistor M6 behaves like a resistor. The transistor M4 then becomes less resistant and the current ICharge rises.

The voltage RAMP rises in this way up to the voltage Vint. The voltage Vpp then follows the voltage RAMP. When the voltage Vpp reaches the voltage Vint, the level detector detects this value. The zener diodes D1 and D2 come on. The input S of the RS flip-flop circuit goes to 1 and the output signal of the flip-flop circuit, BEGRAMP, goes to 1. The native transistor M18 enables the limiting of the current that flows through the zener diodes.

The signal CHARGE then goes to 0. The charging current ICharge for the capacitor C1 is then limited to the current imposed by the transistor M1. This is the start of the part 203 of the rising phase.

During the phase 203, the capacitor C1 gets charged with a current ICharge that is far smaller than previously. The potential TOP as well as the signal RAMP climb more slowly.

Thus, the signal BEGRAMP has gone to 1. This signal is then inverted by the inverter INV1 and brought to the gate of the transistor M19. The transistor M19 goes off and the input S goes back to 0. The signal BEGRAMP at output is held at 1. By this means, the level detector is deactivated to prevent any unnecessary consumption.

Subsequently, the potential TOP reaches a maximum level. The capacitor C1 continues to get charged and the potential BOT falls. Below a threshold close to the threshold voltage Vt of the transistor M5, this potential activates the signal DIS which then goes to 1. The signal DIS activates the discharge circuit of the capacitor C1. The transistor M5 goes off. This is the start of the part 204.

During the phase 204, the signal DIS at the high level turns the transistor M7 on. The capacitor C1 gets discharged by means of all the parallel-connected transistors represented by M8 and M9. The number of parallel-connected transistors is chosen so as to obtain a discharging, at variable speed, of the capacitor C1. The potential at TOP falls as and when the capacitor C1 gets discharged.

The signal RAMP is held at its maximum value obtained at the end of the charging of the capacitor C1, for the transistor M5 is off. The voltage signal Vpp then shows a voltage plateau 204.

The potential TOP falls as and when the discharging takes place and causes the signal DIS to go to 0 when it becomes lower than a threshold potential. At this time, the signal NO_P goes to 1. This is the start of the phase 205.

During this drop in voltage 205, the transistor M11 comes on. The voltage RAMP falls very swiftly to reach a value below the reference voltage. As regards the voltage Vpp, it falls to the reference voltage. The signal NO_P goes again to 1 and the phase 201 starts again.

Various changes can be made to this arrangement. For example, it may be desired to have a ramp signal RAMP different for the programming cycle and for the erasure cycle of a memory cell. In the diagram of FIG. 3a, it is possible for example to turn the ten parallel-connected transistors of M2 on during the programming cycle and activate only half of them during the erasure cycle. The charging of the capacitor C1 will then be slower during the cycle for the erasure of a memory cell. The duration of the erasure cycle of a memory cell will be greater than that of the programming cell.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. An apparatus for programming a floating gate memory cell, the apparatus comprising a ramp generator circuit coupled to the floating gate memory cell, the ramp generator circuit providing a programming signal at an output, the programming signal including a first voltage ramp during which a voltage of the programming signal increases at a first rate, and a second voltage ramp during which the voltage of the programming signal increases at a second rate that is different from the first rate;

wherein the ramp generator circuit includes a circuit that controls the programming signal to increase during the first voltage ramp until the voltage of the programming signal reaches a first predetermined voltage; and wherein the first predetermined voltage is less than a tunnel voltage of the floating gate memory cell.

2. The apparatus of claim 1, further comprising a control circuit having an input that receives the programming signal and an output that provides the programming signal to the floating gate memory cell, to program the floating gate memory cell.

3. The apparatus of claim 1, wherein the second rate is less than the first rate.

4. The apparatus of claim 1, wherein the ramp generator circuit provides the programming signal to a control gate of the floating gate memory cell to program the floating gate to an active state.

5. The apparatus of claim 4, wherein the ramp generator circuit further provides the programming signal to a drain of the floating gate memory cell to program the floating gate to an erase state.

6. The apparatus of claim 5, wherein the ramp generator circuit provides the programming signal to the control gate for a first duration to program the floating gate to an active state, and the ramp generator circuit provides the programming signal to the drain for a second duration that is different from the first duration, to program the floating gate to the erase state.

7. The apparatus of claim 1, wherein the ramp generator circuit includes:
   a capacitor; and
   a capacitor control circuit, coupled to the capacitor, that provides a current of a first magnitude to the capacitor so that the capacitor charges at a first rate during the first voltage ramp, and that further provides a current of a second magnitude that is different from the first magnitude to the capacitor so that the capacitor charges at a second rate during the second voltage ramp, the capacitor providing a voltage by which the programming signal is determined.

8. An apparatus for programming a floating gate memory cell, the apparatus comprising a ramp generator circuit coupled to the floating gate memory cell, the ramp generator circuit providing a programming signal at an output, the programming signal including a first voltage ramp during which a voltage of the programming signal increases at a first rate, and a second voltage ramp during which the voltage of the programming signal increases at a second rate that is different from the first rate;
   wherein the ramp generator circuit includes:
   a first circuit having an input that is responsive to a control signal, and an output that provides an output signal that increases at a rate determined by the control signal; and
   a second circuit having an input that receives the programming signal from the output of the first circuit and an output that provides the control signal to the input of the first circuit in response to a voltage of the programming signal;
   wherein the second circuit includes a detection circuit that detects when the voltage of the programming signal reaches a predetermined voltage, the second circuit asserting the control signal to control the rate of the output signal provided by the first circuit in response to the voltage of the programming signal reaching the predetermined voltage; and
   wherein the predetermined voltage is less than a tunnel voltage of the floating gate memory cell.

9. An memory device comprising:
   a floating gate memory cell; and
   a ramp generator circuit coupled to the floating gate memory cell, the ramp generator circuit having an output that provides a programming signal, the programming signal including a first voltage ramp during which a voltage of the programming signal increases at a first rate, and a second voltage ramp during which the voltage of the programming signal increases at a second rate that is different from the first rate;
   wherein the ramp generation circuit includes a circuit that controls the programming signal to increase during the first voltage ramp until the voltage of the programming signal reaches a first predetermined voltage; and
   wherein the first predetermined voltage is less than a tunnel voltage of the floating gate memory cell.

10. The memory device of claim 9, further comprising a control circuit having an input that receives the programming signal and an output that provides the programming signal to the floating gate memory cell, to program the floating gate memory cell.

11. The memory device of claim 9, wherein the second rate is less than the first rate.

12. The memory device of claim 9, wherein the ramp generator circuit provides the programming signal to a control gate of the floating gate memory cell to program the floating gate to an active state.

13. The memory device of claim 12, wherein the ramp generator circuit further provides the programming signal to a drain of the floating gate memory cell to program the floating gate to an erase state.

14. The memory device of claim 13, wherein the ramp generator circuit provides the programming signal to the control gate for a first duration to program the floating gate to an active state, and the ramp generator circuit provides the programming signal to the drain for a second duration that is different from the first duration, to program the floating gate to the erase state.

15. The memory device of claim 9, wherein the ramp generator circuit includes:
   a capacitor; and
   a capacitor control circuit, coupled to the capacitor, that provides a current of a first magnitude to the capacitor so that the capacitor charges at a first rate during the first voltage ramp, and that further provides a current of a second magnitude that is different from the first magnitude to the capacitor so that the capacitor charges at a second rate during the second voltage ramp, the capacitor providing a voltage by which the programming signal is determined.

16. A memory device comprising:
   a floating gate memory cell; and
   a ramp generator circuit coupled to the floating gate memory cell, the ramp generator circuit having an output that provides a programming signal, the programming signal including a first voltage ramp during which a voltage of the programming signal increases at a first rate, and a second voltage ramp during which the voltage of the programming signal increases at a second rate that is different from the first rate;
   wherein the ramp generator circuit includes:
   a first circuit having an input that is responsive to a control signal, and an output that provides an output signal that increases at a rate determined by the control signal;
   a second circuit having an input that receives the programming signal from the output of the first circuit and an output that provides the control signal to the input of the first circuit in response to a voltage of the programming signal;
   wherein the second circuit includes a detection circuit that detects when the voltage of the programming signal reaches a predetermined voltage, the second circuit asserting the control signal to control the rate of the output signal provided by the first circuit in response to the voltage of the programming signal reaching the predetermined voltage; and wherein the predetermined voltage is less than a tunnel voltage of the floating gate memory cell.

17. A memory device comprising:

a floating gate memory cell;

means for providing a programming signal to the floating gate memory cell, the programming signal including a first voltage ramp during which a voltage of the programming signal increases at a first rate, and a second voltage ramp during which the voltage of the programming signal increases at a second rate that is different from the first rate;

wherein the means for providing includes:

means for increasing a voltage of the programming signal during the first voltage ramp until the voltage of the programming signal reaches a predetermined voltage;

means for increasing the voltage of the voltage of the programming signal during the second voltage ramp from the predetermined voltage to a plateau voltage; and wherein the predetermined voltage is a voltage that is less than a tunnel voltage of the floating gate memory cell.

18. The memory device of claim 17, wherein the first rate is greater than the second rate.

* * * * *